United States Patent [19]
Caneau et al.

[11] Patent Number: 5,732,179
[45] Date of Patent: Mar. 24, 1998

[54] BIREFRINGENCE-FREE SEMICONDUCTOR WAVEGUIDE

[75] Inventors: Catherine Genevieve Caneau, Red Bank, N.J.; Ghie Hugh Song, Kwangju, Rep. of Korea; Julian Bernard Donald Soole, Edison, N.J.

[73] Assignee: Bell Communications Research, Inc., Morristown, N.J.

[21] Appl. No.: 413,577

[22] Filed: Mar. 30, 1995

[51] Int. Cl.$^6$ .................................................. G02B 6/10
[52] U.S. Cl. ........................................................ 385/131
[58] Field of Search .................... 385/130, 131, 385/147, 129; 357/16, 4, 19, 30, 90

[56] References Cited

U.S. PATENT DOCUMENTS

| | | | |
|---|---|---|---|
| 5,008,717 | 4/1991 | Bar-Joseph et al. | 372/43 X |
| 5,028,108 | 7/1991 | Young | 385/130 |
| 5,034,783 | 7/1991 | Chang et al. | 385/130 |
| 5,090,790 | 2/1992 | Zucker | 385/130 |
| 5,115,488 | 5/1992 | Islam et al. | 385/131 |
| 5,117,469 | 5/1992 | Cheung et al. | 385/11 |
| 5,159,481 | 10/1992 | Maeda | 359/189 |

OTHER PUBLICATIONS

Soole et al., "Monolithic InP/ GaAsP/InP grating spectrometer for the 1.48–1.56um wavelength range," *Applied Physics Letters*, vol. 58, 1991, pp. 1949–1951.

M. Zirngibl et al., "Demonstration of a 15×15 Arrayed Waveguide Multiplexer on InP," *IEEE Photonics Technology Letters*, vol. 4, 1992, pp. 1250–1253.

Heismann, "Analysis of a Reset–Free Polarization Controller for Fast Automatic Polarization Stabilization in Fiber–optic Transmission Systems", *Journal of Lightwave Technology*, vol. 12, 1994, pp. 690–699.

Heismann et al., "Electrooptic Polarization Scramblers for Optically Amplified Long–Haul Transmission Systems," *IEEE Photonics Technology Letters*, vol. 9, 1994, pp. 1156–1158.

Bissessur et al., "16 channel phased array wavelength demultiplexer on InP with low polarization sensitivity," *Electronics Letters*, vol. 30, 1994, pp. 2336–2337.

Chiang, "Dispersion characteristics of strip dielectric waveguides," *IEEE Transactions on Microwave Theory and Techniques*, vol. 39, pp. 349–352, 1991.

Verbeek et al., "Large Bandwidth Polarization Independent and Compact 8 Channel PHASAR Demultiplexer/Filter.", PD13, Optical Fiber Conference, pp. 63–65, San Jose, CA., Feb. 20–25, 1994.

(List continued on next page.)

*Primary Examiner*—Akm E. Ullah
*Attorney, Agent, or Firm*—James W. Falk; Joseph Giordano

[57] ABSTRACT

A birefringence-free semiconductor waveguide comprising on a substrate a plurality of layers some of which are in tensile strain with respect to the substrate and others of which are in compressive strain. Birefringent-free behavior with respect to a guided light signal traveling in the waveguiding structure and possessing a photon energy lower than the bandgap of the constituent waveguide layers is obtained when birefringence introduced into the individual layers of the waveguiding structure by the strain is sufficient to compensate for the intrinsic geometric modal birefringence of the waveguiding structure that exists in the case where all layers are not strained. This is achieved through the introduction of a predetermined amount of tensile strain into one of more layers possessing a bandgap energy relatively close to the photon energy of the guided light and the introduction of a predetermined amount of compressive strain into one or more layers possessing a bandgap energy that is relatively further from the photon energy of the guided light signal. In this manner, waveguiding structures that are substantially free of modal birefringence may be obtained with partial or complete strain compensation so as to avoid any strain-induced defects.

20 Claims, 5 Drawing Sheets

OTHER PUBLICATIONS

Zucker et al., "Strained quantum wells for polarization-independent electrooptic waveguide switches," *Journal of Lightwave Technology*, vol. 10, 1992, pp. 1926–1930.

Joma et al., "Strained layer quantum well semiconductor optical amplifiers: polarization-insensitive amplification", *Fiber and Integrated Optics*, vol. 10, 1991, pp. 361–364.

Ravikumar et al., "Observation of polarization independent electro-optic effect in InGaAs/InP tensile strained quantum well and its proposal for optical switch," *Applied Physics Letters*, vol. 61, 1992, pp. 1904–1906.

Tiemeijer et al., "Polarization insensitive multiple quantum-well laser amplifiers for the 1300nm window," *Applied Physics Letters*, vol. 62, 1993, pp. 826–829.

Newkirk et al., "1.5 um Multiquantum-Well Semiconductor Optical Amplifier with Tensile and Compressively Strained Wells for Polarization-Independent Gain," *IEEE Photonics Technogty Letters*, vol. 4, 1993, pp. 406–408.

Tada et al., "Polarization-independent optical waveguide intensity switch with parabolic quantum well," *Applied Physics Letters*, vol. 59, 1991, pp. 2778–2780.

Yamaguchi et al., "Polarization-Independent Waveguide Modulator Using a Novel Quantum Well with Mass-Dependent Width", *IEEE Photonics Technology Letters*, vol. 6, 1994, pp. 1442–1444.

Marcuse, *Theory of Dieletric Optical Waveguides*, 2nd ed., Academic Press, 1991, pp. 1–59.

Matthews et al., "Defects in Epitaxial Multilayers," *Journal of Crystal Growth*, vol. 27, 1974, pp. 118–125.

Adachi, *Physical Properties of III–V Semiconductory Compounds: InP, InAs, GaAs, GaP, InGaAs, and InGaAsP*, Wiley, 1992, pp. 193–201, pp. 263–287.

BIREFRINGENCE-FREE SEMICONDUCTOR WAVEGUIDE

FIELD OF THE INVENTION

This invention relates to semiconductor opto-electronic devices; in particular, it relates to semiconducting optical waveguides.

BACKGROUND ART

Optical and electro-optic devices that are free from birefringence are needed for fiber optic communications systems. The majority of fiber optic telecommunications systems use standard single-mode silica fiber that does not preserve the polarization of the transmitted light. For such systems, the polarization state of the light signal in the optical fiber at any point and at any time is unknown and subject to variation over time and distance as a result of environmental and other changes that occur along the historical transmission path of the signal. If devices placed at any point in the fiber transmission path or at its end have response characteristics that depend on the polarization state of the light, the signal may degrade and in the limit may be lost altogether.

Optical and electro-optical devices that possess a well defined optical plane in general display some polarization dependence; that is, they perform in a certain manner for light polarized in that optical plane and a somewhat different fashion for light polarized perpendicular to the optical plane. The optical plane can be defined by almost any optical or other physical variation differing in two perpendicular directions. Specifically, integrated optical and electro-optical devices that contain waveguide structures with mode guiding cross sections that are asymmetric about the direction of propagation of the guided light are in general birefringent, presenting somewhat different modal effective indices for guided light signals that are electrically polarized parallel to the plane of the integrated device (transverse electric or TE) and for those polarized perpendicular to the plane of the integrated device (transverse magnetic or TM). This may lead to substantially different behavior of the integrated device for guided light signals that are TE polarized and those that are TM polarized. In cases where the polarization state of the input light signal is not fixed in such a manner as to generate exclusively TE or TM polarized guided wave light, this behavioral difference may degrade the operational performance of the device.

Examples of such birefringence-sensitive integrated optical devices are semiconductor waveguide wavelength multiplexer/demultiplexers, such as one based on etched reflection gratings as disclosed by Soole et al. in "Monolithic InP/InGaAsP/InP grating spectrometer for the 1.48–1.56 μm wavelength range," *Applied Physics Letters*, vol. 58, 1991, pp.1949–1951 or a phased array-based demultiplexer as disclosed by M. Zirngibl et al. in "Demonstration of a 15×15 Arrayed Waveguide Multiplexer on InP," *IEEE Photonics Technology Letters*, vol. 4, 1992, pp. 1250–1253. However, these devices suffer performance degradation when used with unpolarized signals because modal birefringence causes TM polarized guided light signals to disperse at slightly different angle than TE polarized guided light signals. This angular difference results in TM signals carried by guided light of one wavelength being dispersed in the same direction as signals carried by TE polarized light of a slightly different wavelength. The congruence of two signals of slightly different wavelengths causes cross-talk between signals carried on the different wavelengths where the guided light signals contain components of both polarization states. Integrated routing devices utilizing semiconductor waveguides present another class of devices that are in general sensitive to the polarization state of the guided wave signal through differences in modal effective index for TE and TM polarized guided light and may similarly suffer performance degradation when operating on guided light signals with both TE and TM polarization states. Examples of such routing devices are provided by directional couplers, Mach-Zehnder interferometric couplers, and multi-mode interference devices. Examples of these devices are described by Hunsperger, *Integrated Optics: Theory and Technology*, 3d ed., Springer, Heidelberg, 1991, by D. Green, *Fiber Optic Networks*, Prentice Hall, 1993, and by Soldano, *Multimode Interference Couplers*, Delft University Press, 1994.

As integrated optical and electro-optical devices are generally employed in fiber optic systems for which the polarization state of the light signal is unknown, strenuous efforts have been expended to circumvent or minimize the consequences of the polarization dependence of these devices.

The most popular approach for reducing the effects of birefringence has been to introduce additional components to control the state of polarization of the light signal before its introduction to the polarization-sensitive device. These methods include polarization diversity as described by Green, ibid. at pp. 316–318, polarization-controlling and active polarization scrambling, the latter two as described by Heismann in "Analysis of a Reset-Free Polarization Controller for Fast Automatic Polarization Stabilization in Fiber-optic Transmission Systems", *Journal of Lightwave Technology*, vol. 12, 1994, pp. 690–699 and by Heismann et al. in "Electrooptic Polarization Scramblers for Optically Amplified Long-Haul Transmission Systems," *IEEE Photonics Technology Letters*, vol. 9, 1994, pp. 1156–1158, and passive polarization scrambling as described by Maeda in U.S. Pat. No. 5,159,481. However, these methods all involve additional components and interconnections between them, introducing a complexity that is better avoided. A more satisfactory approach is obtained where the waveguide device itself can be designed so as to have a polarization dependence that is small enough to cause negligible system degradation for the application with which it is used.

Semiconductor waveguides in which the difference in refractive index between the waveguide core and the waveguide cladding regions is relatively small, or in which the mode field has substantial portions extending into the cladding, such as just below cutoff, or in which the mode field is substantially contained within the guide core display a weaker modal birefringence than waveguide structures for which this is not the case. The first effect has been recently exploited by Soole et al. in the previously cited article, and by Bissessur et al. in "16 channel phased array wavelength demultiplexer on InP with low polarization sensitivity," *Electronics Letters*, vol. 30, 1994, pp. 2336–2337. However, such guides are often not suitable for incorporation into guided wave devices and often still display non-negligible modal birefringence for the guided light signals. Buried rib waveguides of square cross-section with thick upper cladding layers are by reason of symmetry free of guided mode birefringence. Also, certain geometries of waveguide cross section, such as strip waveguides with carefully predetermined refractive index contrast and dimension ratios can also be rendered birefringence-free, as has been explained by Chiang in "Dispersion characteristics of strip dielectric waveguides," *IEEE Transactions on Microwave Theory and Techniques*, vol. 39, pp. 349–352, 1991. This effect has been exploited by Verbeek et al. in "Large Bandwidth Polarisation Independent and Compact 8 Channel PHASAR Demultiplexer/Filter," post-deadline paper, PD13, Optical Fiber Conference, pp. 63–65, San Jose, Calif., Feb. 20–25, 1994. However, these specific structures are often not useful for incorporation into an integrated optical or electro-optic device.

It is well known that strain introduced into quantum wells within a waveguiding region will affect the birefringence, as disclosed for example by Cheung et al. in U.S. Pat. No. 5,117,469. A number of polarization-independent devices employing waveguides that contain quantum wells have been proposed and demonstrated. One type has been disclosed by Zucker in U.S. Pat. No. 5,090,790 and by Zucker et al. in "Strained quantum wells for polarization-independent electrooptic waveguide switches," *Journal of Lightwave Technology*, vol. 10, 1992, pp. 1926–1930. These references teach that the incorporation of tensile strain into a quantum-well layer acts upon the band structure of quantum-well material in a manner which is such as to oppose the effect of the splitting of the light and heavy holes in the valence band caused by quantum size effect. Further, the incorporation of sufficient predetermined tensile strain in the quantum-well layers suppresses the polarization sensitivity of certain properties of a quantum-well waveguiding region so that the behavior becomes substantially similar for TE and TM polarized light guided within it.

A number of quantum-well device structures have been reported, as described below, that employ tensile strain in the quantum wells in a similar manner to the disclosure by Zucker. Joma et al. describe quantum-well amplifiers in "Strained layer quantum well semiconductor optical amplifiers: polarization-insensitive amplification," *Fiber and Integrated Optics*, vol. 10, 1991, pp. 361–364. Ravikumar et al. describe waveguides demonstrating field-induced absorption in "Observation of polarization independent electrooptic effect in InGaAs/InP tensile strained quantum well and its proposal for optical switch," *Applied Physics Letters*, vol. 61, 1992, pp. 1904–1906. Zucker et al., ibid., describe an interferometric switch. Other examples of devices that employ effects unique to quantum wells in order to obtain substantially equivalent performance for TE and TM polarized light have included quantum-well guided wave amplifiers containing both compressively strained and tensile strained quantum wells to generate optical gain for TE and TM polarized guided light that is substantially equal, as described by Tiemeijer et al. in "Polarization insensitive multiple quantum-well laser amplifiers for the 1300 nm window," *Applied Physics Letters*, vol. 62, 1993, pp. 826–828 and by Newkirk et al. in "1.5 μm Multiquantum-Well Semiconductor Optical Amplifier with Tensile and Compressively Strained Wells for Polarization-Independent Gain," *IEEE Photonics Technology Letters*, vol. 4, 1993, pp. 406–408. Tada et al. have described quantum-well intensity switches that employ parabolic quantum wells in "Polarization-independent optical waveguide intensity switch with parabolic quantum well," *Applied Physics Letters*, vol. 59, 1991, pp. 2778–2780. Finally, Yamaguchi et al. describes modulators that employ quantum wells with mass-dependent widths in "Polarization-Independent Waveguide Modulator Using a Novel Quantum Well with Mass-Dependent Width," *IEEE Photonics Technology Letters*, vol. 6, 1994, pp. 1442–1444.

The design of the above mentioned examples fundamentally depends on the presence of quantum wells for the attainment of polarization insensitive performance. The teachings of this prior art are thus limited to waveguiding structures that contain layers that are thin enough for quantum size effects to be significant. Further, none of this prior art directly teaches the suppression of the modal birefringence of the waveguiding structures. Birefringence suppression requires that the device display the same effective optical refractive indices for the two polarizations of guided light while polarization insensitivity of, for example, an active amplifier requires that some optical parameter such as the optical gain be the same for the two polarizations. Although Zucker suggests the equalization of material refractive indices for the two polarizations as they propagate along a layer of the waveguiding structure, the only method she teaches involves the equalization of the absorption α. Although Zucker uses tensile strain to equalize the ratio of oscillator strengths versus wavelength detuning for heavy and light holes for the two orthogonal polarizations TE and TM, her procedure does not assure equivalence of the modal indices $\beta/k_o$ of guided light of the two polarizations modes supported by a waveguide structure that contains one or more of these tensilely strained layers. The equalization of modal indices is a more complex and fundamental problem.

The following description shows how the inclusion of purposefully predetermined both compressively and tensilely strained layers in a waveguide structure may be used to achieve modal birefringence-free behavior of that waveguiding structure. It relates in general to waveguiding structures without regard to the possible manifestation of quantum size effects in thin layers contained within the guiding structure. The means of birefringence suppression as disclosed is applicable to a wide variety of waveguide structures including, but not to be limited to, those commonly termed planar guides, ridge guides, strip-loaded guide, and buried rib guides.

SUMMARY OF THE INVENTION

The invention may be summarized as a semiconductor waveguide structure in which the modal birefringence between the two polarizations is substantially reduced or eliminated altogether by introducing a predetermined amount of strain into the layers comprising the waveguide. The waveguide guides light signals possessing a photon energy lower than the bandgap of the constituent waveguide layers.

Strain induced in otherwise optically isotropic material produces optical birefringence in the material. Thus, in-plane strain can be used to control the modal birefringence of the waveguiding structure. In general, the introduction of strain into a layer that is in tensile strain with respect to the substrate acts to reduce the modal birefringence of the waveguiding structure that arises from the geometry of the waveguiding structure; and, vice versa, the introduction of compressive strain increases the modal birefringence of the waveguiding structure. However, in general, the amount of tensile strain in a single layer required to totally compensate the structural birefringence exceeds the levels at which defects form in that layer. The invention allows sufficient tensile strain without defect formation.

The birefringence introduced by a given amount of strain in a semiconductor layer is a function of the separation between the bandgap energy of the semiconductor material and the photon energy of the light experiencing the birefringence and increases in magnitude as the photon energy approaches the band edge energy of the strained material. This functional dependence allows a controlled method of introducing strain into a multi-layer waveguide structure in such a manner that the tensile strain introduced into one or more of the layers may be partially or completely compensated by the introduction of compressive strain into one or more other layers so that the net strain limits are not exceeded and in toto the strained structure introduces a net birefringence that suppresses or substantially eliminates the modal birefringence of the waveguide structure for a range of photon energies of waveguided light.

For waveguiding structures comprising materials of the III–V and II–VI group elements, birefringence can conveniently be reduced by introducing a predetermined amount of tensile strain into a layer or layers possessing a bandgap energy closer to the photon energy of the guided light and introducing a predetermined amount of compressive strain into the layer or layers possessing a bandgap energy further from the photon energy of the guided light signal. In this manner, waveguiding structures that are substantially free of modal birefringence for guided light signals of a range of photon energies may be realized in waveguiding structures that are either partially or completely strain-compensated.

BRIEF DESCRIPTION OF THE DRAWINGS

FIG. 1 illustrates a planar waveguide structure, FIG. 2 illustrates a ridge waveguide structure, FIG. 3 illustrates a striploaded waveguide structure, and FIG. 4 illustrates a buried rib waveguide structure.

DETAILED DESCRIPTION OF THE PREFERRED EMBODIMENTS

Figure 1:
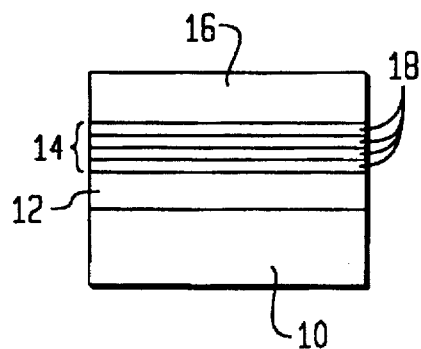
FIGS. 1 through 4 are cross-sectional views of illustrative examples of waveguide structures that may be rendered free of birefringence in accordance with the invention. The figures are drawn in cross section perpendicular to the direction of propagation of the waveguided light.
Figure 2:
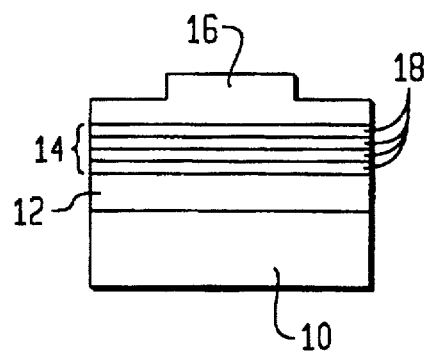
Figure 3:
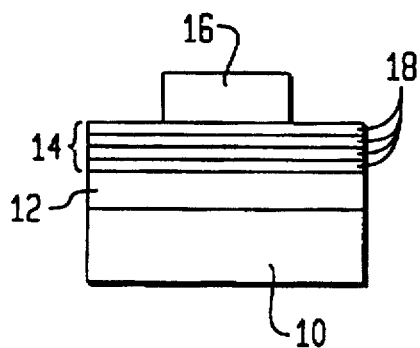
Figure 4:
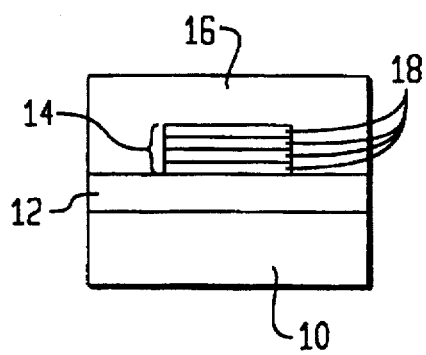

The invention can be implemented in a number of different waveguiding structures including those shown in cross section in FIGS. 1–4 in a plane perpendicular to the direction of the propagation of light. The guide structures are often classified, among other possibilities, as a planar waveguide as shown in FIG. 1, a ridge waveguide as shown in FIG. 2, a strip-loaded waveguide as shown in FIG. 3, or a buried rib waveguide as shown in FIG. 4. The waveguide structures are formed on a substrate 10 and further comprise a lower cladding layer 12, a guiding core layer 14, and an upper cladding layer 16 The waveguide core 14 contains a plurality of layers 18 which are strained according to the description of the invention contained below. The diagrammatic representations of FIGS. 1–4 are for illustrative purposes only, and the invention is not limited to the illustrated shapes, either in form or relative dimension. In particular, the waveguide core may contain layers of unequal thickness and layers that are both strained and unstrained, and the upper and lower cladding layers may comprise several layers some of which may also be strained.

In order for the structures depicted in FIGS. 1–4 to waveguide light centered on the waveguide core 14 of a particular photon energy, the core must in general possess an effective index of refraction that is higher than that of the surrounding regions. Precise conditions for efficient waveguiding and the evaluation of the effective index of the guided modes and the form of the guided mode field profiles can be determined by the usual methods familiar to those skilled in the design of semiconductor waveguides.

Semiconductor waveguide structures such as those represented in FIGS. 1–4 can be grown by any of the several well known growth techniques practiced by those skilled in the art of semiconductor crystal growth. If a layer is grown so as to be lattice matched to the substrate material, the layer material is unstrained. Where such an unstrained layer is composed of a material with a cubic crystal structure such as the zinc blende structure of semiconductor compounds formed from III–V and II–VI group elements and the layer is not so thin that quantum size effects are significantly manifest, the layer is optically isotropic.

Waveguide structures containing optically isotropic layers nonetheless still in general exhibit a degree of modal birefringence. That is, the TE optical eigenmode having the electrical vector within the plane of the layers and perpendicular to the direction of propagation has an effective index $$n_{TE} = \frac{\beta_{TE}}{k_0}, \tag{1}$$

where $\beta_{TE}$ is the propagation constant for the TE guided mode within the waveguide and $k_0$ is the propagation constant in free space. Similarly, the effective index for the orthogonal mode having the magnetic vector within the plane is given by $$n_{TM} = \frac{\beta_{TM}}{k_0}. \tag{2}$$

The difference between $n_{TE}$ and $n_{TM}$ arises because the electromagnetic boundary conditions at the interfaces between the layers differently affect the guided modes of the two polarizations TE and TM.

Analysis shows that the modal index $n_{TE}$ for TE polarized light is in general greater than the modal index $n_{TM}$ for TM polarized light. This relationship can be shown easily, for example, in the case of a waveguide as illustrated in FIG. 1 having a single guiding layer 14 with an index higher than that of the cladding layers 12 and 16, see Marcuse, *Theory of Dielectric Optical Waveguides*, 2nd ed., Academic Press, 1991, pp. 1–59. The relationship is generally true for waveguide structures with high-index core layers that have waveguide cross sections that may be regarded as perturbations of the planar waveguide structure, such as are illustrated in FIGS. 2–4. In general, other things being equal, the larger is the refractive index discontinuity $n_{core} - n_{clad}$ at the interface between the waveguiding core 14 and the cladding layers 12 and 16 (often termed the refractive index contrast), the larger the modal birefringence that is present.

As noted above, for many integrated optic and electro-optic devices incorporating waveguiding structures, the effective index of the guided mode is crucial to the operation of that device and the presence of modal birefringence is detrimental to the performance if the device operates with light signals of mixed TE and TM polarization states. In general, all integrated optic devices whose optical signal processing function is determined by the modal index of the waveguided signal will suffer degraded performance because of non-zero birefringence if light signals of mixed TE and TM polarizations are present.

The optical birefringence can be manipulated by the controlled introduction of strain into the signal-bearing semiconductor layers. These layers may be epitaxially grown on an underlying substrate of a different composition and slightly different lattice constant if strain can be accommodated without material relaxation. Such an overgrown layer is said to be coherently strained and the in-plane strain is accompanied by a distortion of the crystal structure in the direction normal to the substrate. Hereafter, stress and strain will refer to the biaxial stress and strain within the plane of the device.

Within the limits of stability, the in-plane lattice constants of the after grown layer match those of the substrate and the out-of-plane lattice constant changes in the opposite direction so that in-plane, biaxial strain of one sign is accompanied by axial strain of the other sign in the direction perpendicular to the layers. Provided that the strain energy within the grown layer is kept below certain limits required to prevent the formation of crystal dislocations, such coherently strained layers may be grown using methods familiar to those skilled in semiconductor crystal growth, and they are stable over time with respect to the introduction of defects. The existence of such stable layers was first disclosed by Matthews et al. in "Defects in epitaxial multilayers," *Journal of Crystal Growth*, vol. 27, 1974, pp. 118–125. The presence of strain in such layers causes internal stress, and stress in the otherwise optically isotropic zinc-blende III-V and II-VI cubic crystal groups introduces a measure of optical birefringence. The birefringence so introduced into a layer of strained semiconductor material contained within a waveguiding structure modifies the modal birefringence of that waveguiding structure.

The birefringence present in a stressed material is expressed by the photoelastic coefficient, which relates the induced difference between the real parts of the dielectric constants measured parallel $\epsilon_\parallel$ and perpendicular $\epsilon_\perp$ to the direction of the applied stress $X_\parallel$, where the parallel direction is within the plane of the generally planar structure. Adachi describes various aspects of photoelasticity of relevant compound semiconductors in the text *Physical Properties of III-V Semiconductor Compounds: InP, InAs, GaAs, GaP, InGaAs, and InGaAsP*, Wiley, 1992, pp. 193–222. The first order linear photoelastic coefficient $\alpha_{PE}$ is given by $$\epsilon_\parallel - \epsilon_\perp = \alpha_{PE} X_\parallel. \tag{3}$$

Figure 5:
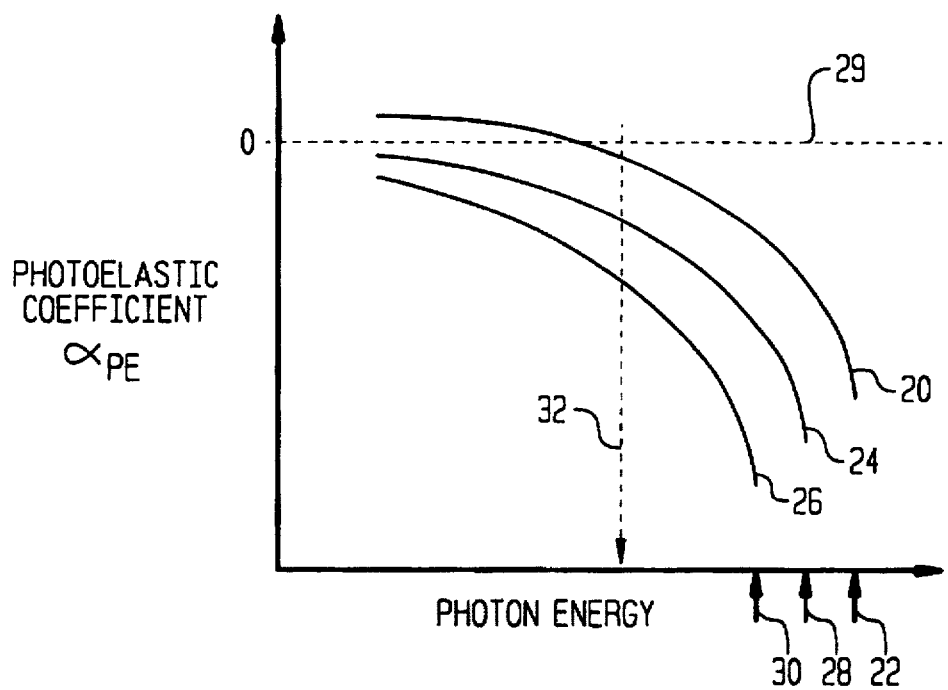
FIG. 5 illustrates the dependence of the photoelasticity of semiconductor material on the photon energy of the light for which the photoelasticity is measured. The photoelasticity of three different materials are indicated, their respective bandgap energies being indicated by the arrow markers on the ordinate energy axis. The photon energy for which there is no photoelastic effect depends on the semiconductor material and, if such a condition exists, commonly occurs for a low photon energy far from the bandgap energy.

The photoelastic coefficient of semiconductor materials is known to vary with the wavelength of the light at which it is measured, and in general it has a larger negative absolute value for photon energies that are closer to the material bandgap. For example, Adachi shows experimental data for the linear photoelastic coefficients of the binary III-V semiconductors InAs, InP, GaAs, and GaP for strained layers grown on the principal device substrate growth planes (100) and (111). Typical variations of photoelasticity as a function of photon energy are schematically illustrated in FIG. 5 for a series of this class of materials. Curve 20 shows a typical variation of the photoelastic coefficient with light energy for a particular material composition. The corresponding electronic bandgap energy of the material is indicated by the arrow 22. Curves 24 and 26 represent the photoelastic coefficients for two other materials with corresponding bandgap energies 28 and 30, respectively. The curves 20, 24 and 26 show that the photoelastic coefficient monotonically decreases with increasing negative slope for increasing intra-bandgap photon energy and precipitously falls at the bandgap energy 22, 28, or 30. This behavior is general for many semiconductor materials, such as those formed of the III-V and II-VI group elements, and differs only in the detailed form of the curves and the point at which the curve, in some cases, crosses through a zero value 29 of the photoelasticity on the abscissa.

The in-plane stress of a strained layer is related to the layer strain by the compliance tensor which, in the matrix notation developed for cubic crystals, may be expressed as $$X_i S_{ij} = Z_j, \tag{4}$$

where X is the stress, Z is the strain, and S is the compliance matrix. In the common case of epitaxial growth on the (100) substrate plane, the in-plane stress may be expressed as $$X_\parallel = \frac{1}{S_{11} + S_{12}} \cdot \frac{a_s - a_c}{a_c}, \tag{5}$$

where $a_s$ is the substrate lattice constant and $a_c$ is the relaxed lattice constant of the strained layer so that $(a_s - a_c)/a_c$ is the in-plane strain of the strained layer.

Combining Equations (4) and (5) gives the relationship between the in-plane layer strain and the layer birefringence for strained layers grown on a (100) substrate, $$\epsilon_\parallel - \epsilon_\perp = \frac{\alpha_{PE}}{S_{11} + S_{12}} \cdot \frac{a_s - a_c}{a_c}, \tag{6}$$

In at least this class of materials, the factor $1/(S_{11}+S_{12})$ is positive, and a consideration of signs shows that tensile strain in a layer introduces a birefringence into the layers that reduces the value of modal birefringence $$n_{TE} - n_{TM} > 0 \tag{7}$$

of the sign noted above by Marcuse for typical waveguiding structures.

The introduction of sufficient tensile strain into one or more of the component layers of a waveguide tends to reduce the modal birefringence of the waveguiding layer structure to zero. However, as noted above, strain cannot be arbitrarily incorporated into grown layers. Rather, the amount of strain must be kept below certain limits dependent on the thickness of the layer and on the conditions under which the growth process is performed (see Matthews et al., ibid.). Computation shows that the amount of strain required to reduce to zero the birefringence of most generally used semiconductor waveguiding structures exceeds the pseudomorphic limit at which the strained layer relaxes to form dislocations. The formation of dislocations will prevent the amount of introduced strain from achieving the desired reduction of birefringence.

The invention provides a semiconductor waveguide structure that contains both tensilely and compressively strained but stable and dislocation-free layers that waveguide light within a predetermined optical frequency range with zero or substantially reduced birefringence. A semiconductor waveguide structure comprising a plurality of layers, some in tensile strain and some in compressive strain, can be formed to be substantially free of modal birefringence for guided light signals of a range of photon energies lower than the bandgap energies of the constituent waveguide layers. Birefringence-free behavior is obtained through the application of a predetermined amount of tensile strain to one or more layers possessing bandgap energies closer to the photon energy of the guided light and a predetermined amount of compensating compressive strain to one or more layers with bandgap energy further from the photon energy of the guided light signal. The closer proximity of the energy of the guided light to the bandgap energy of the tensilely strained material results in the dominance of the modal birefringence suppression caused by the tensilely strained layers. A waveguide structure with zero or near-zero modal birefringence and zero or near-zero net strain energy may be so formed.

The disclosed principle may be shown by an illustrative and non-limiting example. Consider a material system that may be grown with a continuously variable bandgap energy achieved by adjusting the material composition. The photoelastic coefficient of the different material compositions have functional dependencies as illustrated in FIG. 5. The birefringence induced for a given amount of in-plane strain for photon energies below the bandgap, such as the photon energy 32 in FIG. 5, varies with the bandgap energy of the material as illustrated by curve 34 in FIG. 6. Because the elastic constants of these materials are relatively constant as a function of composition, see Adachi, ibid., pp. 20–26, the shape of curve 34 depends primarily on the photoelastic coefficient $\alpha_{PE}$. The proportionality factors are given by Equation (6). Curve 34 can be obtained from the crossing points of the photon energy line 32 and the photoelasticity curves 20, 24, and 26 of FIG. 5 as measured by their bandgap energies 22, 28, 30.

Figure 6:
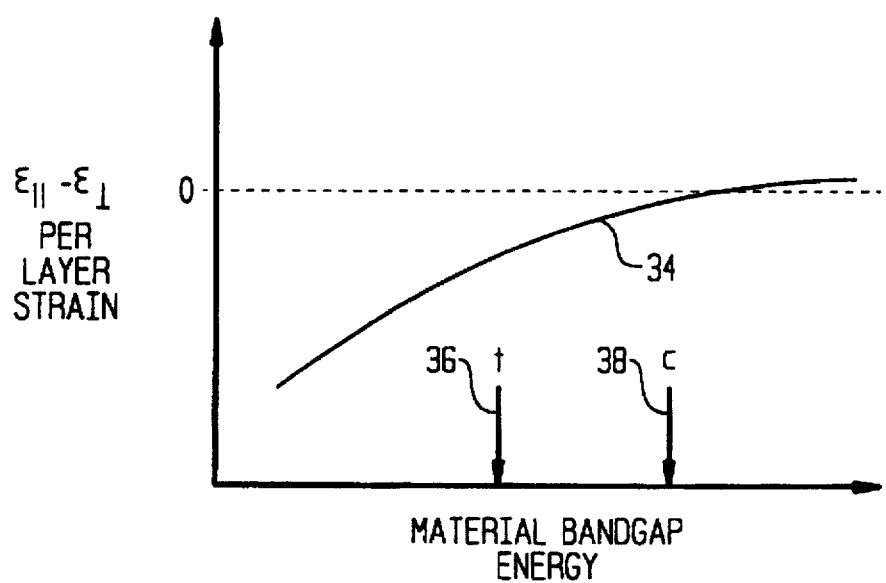
FIG. 6 illustrates the variation in birefringence observed for a given layer strain at a photon energy below the bandgap in a semiconductor material system for which the bandgap is continuously variable through a continuous change of the material composition. Such a curve may be obtained from a set of curves such as depicted in FIG. 5 at the photon energy indicated by the dashed line.

Consider also the case of a planar guide structure as depicted in FIG. 1 in which the upper and lower cladding layers 16 and 12 have a similar material composition and are unstrained and in which the core 14 is composed of a superlattice of alternatively tensilely strained and compressively strained layers of equal thickness and strain. In this case, as illustrated in FIG. 6, the tensilely strained layers are chosen to have a composition with bandgap energy 36 that is relatively nearer to the photon energy 32 of the guided light, and the compressively strained layers are chosen to have a bandgap energy 38 that is relatively further away, both the bandgap energies 36 and 38 being above the photon energy.

In view of the form of curve 34, the birefringence induced by the strain in the tensilely strained layers is greater than the birefringence induced in the compressively strained layers of equal thickness and strain, and there is therefore a net birefringence that the strain induces in the core of the waveguide. The sign of the net induced birefringence is such as to suppress the modal birefringence of the waveguide structure. That is, the net birefringence is dominated by the tensile strain. By appropriately tuning the layer strains, the modal birefringence may be completely suppressed at the energy of the guided light and rendered substantially zero for a range of energies about that value. Because the waveguide structure incorporates equal numbers of layers with equal and opposite strain, the net internal strain energy is zero and the structure is thermodynamically stable.

DESIGN PROCEDURE

Figure 7:
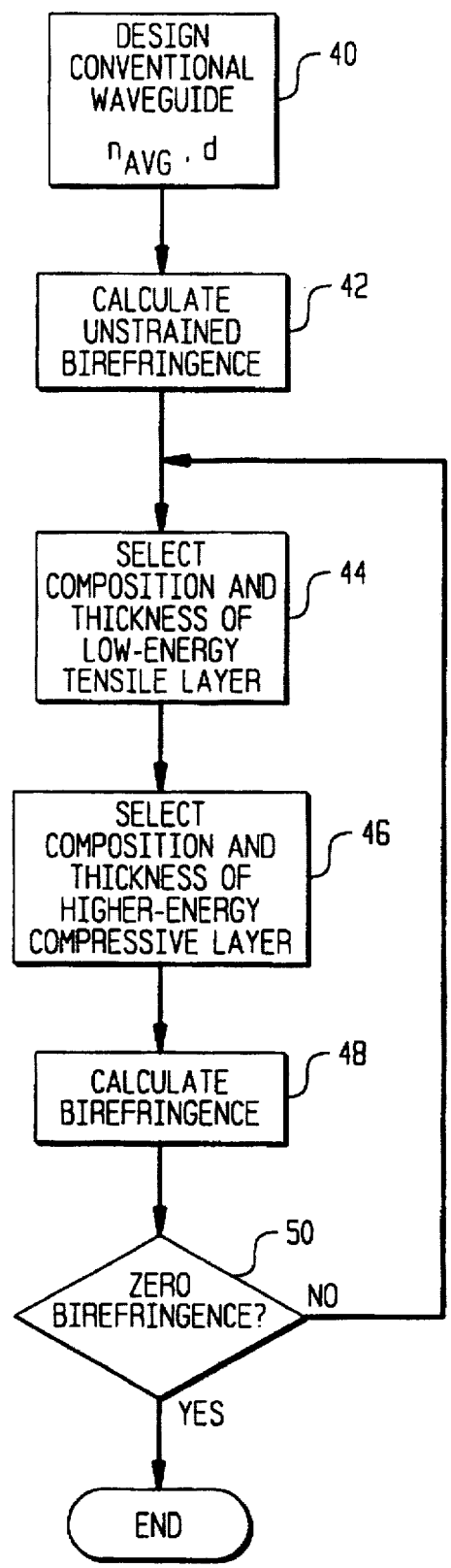
FIG. 7 is a flow diagram of a procedure for designing the waveguide of the invention with minimized birefringence.

A superlattice waveguide can be designed to have substantially zero birefringence at a given wavelength with the following procedure shown in FIG. 7.

First, in step 40, design a waveguide according to conventional rules so as to establish the effective index of the waveguide that is required and the general mode size range that is acceptable. For given cladding materials, these two parameters determine the average index $n_{AVG}$ of the guide core and its thickness d. This part of the design procedure has been well developed for a number of different structural geometries. Marcuse, ibid., provides an analytical foundation. As a very simple example, consider a core layer of refractive index $n_2$ and thickness $t_g$ sandwiched between two thick cladding layers of refractive index $n_1$. As described by Hunsperger ibid. at p. 34, this structure can support TE modes represented by respective integers $m_s$, if $$n_2 - n_1 > \frac{m_s^2 \lambda_0^2}{4 t_g^2 (n_2 + n_1)}, \tag{8}$$

where $\lambda_0$ is the free-space wavelength of the optical radiation. For single-moded operation, the total effective core thickness $t_g$ is chosen to give equality of Equation (8) for a value of $m_s$ less than 1 so as to provide only a single supported mode, $m_s=0$. For the typical materials presented in the examples below, the conditions are such as to support a single guided mode of both TM and TE polarizations.

In step 42, calculate the modal birefringence that is present if the guide core is a single unstrained layer. This is done by explicitly considering the waveguide structure with the appropriate boundary conditions. Analytical expressions for the simple case presented above are given, for example, by Marcuse, ibid., at pp. 1–19. This amount of modal birefringence needs to be suppressed.

Figure 8:
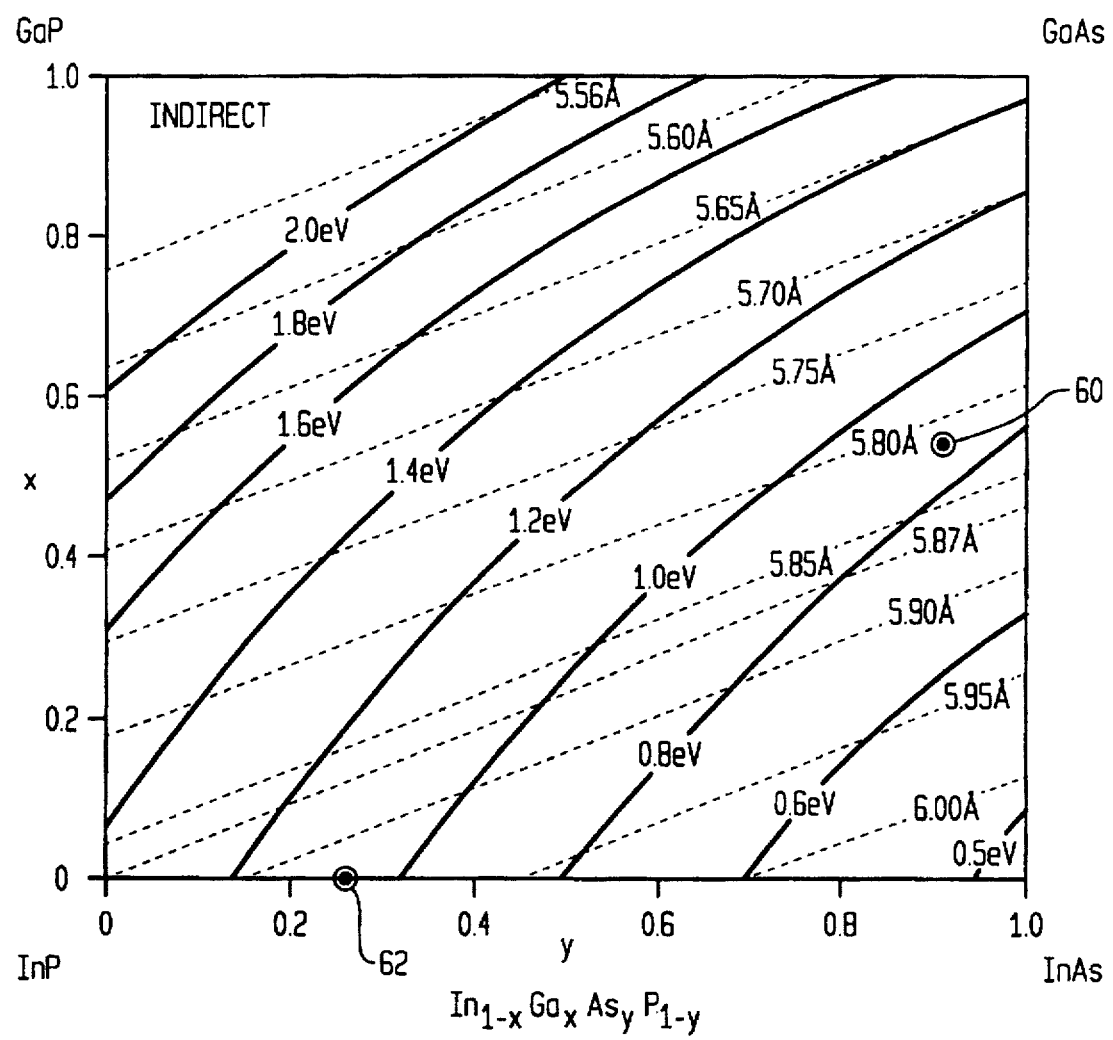
FIG. 8 is a graph for the bandgap energy and the lattice constant of the material family InGAasP.

An equivalent waveguide core is formed with a superlattice in which the refractive indices of the paired layers bracket the average index $n_{AVG}$; that is, a first layer has refractive index $n_1 > n_{AVG}$, and a second layer has refractive index $n_2 < n_{AVG}$. To select the two compositions it is helpful to rely upon a graph of the type illustrated in FIG. 8 that is similar to one shown by Swaminathan et al., *Materials Aspects of GaAs and InP Based Structures*, Prentice Hall, 1991, p. 13. This graph shows for the quaternary compound $In_{1-x}Ga_xAs_yP_{1-y}$ the values of the bandgap energies in solid lines and the lattice parameters in dashed lines as a function of both compositional parameters x and y. The area at the upper left produces indirect bandgaps, which are not of interest. The lattice parameter 5.87 Å provides near lattice matching to InP. When an InP substrate is used, materials with relaxed lattice constants above 5.87 Å (to the bottom of the line in the graph) exhibit compressive strain while materials with relaxed lattice parameters below 5.87 Å exhibit tensile strain In step 44, place the composition of the layer with the lower energy bandgap at a compositional point 60 with a bandgap energy close to that of the operating light (1.55 μm wavelength or 0.8 eV energy) but sufficiently higher in energy than the light so as to avoid significant absorption in the band tail. The lattice parameter is chosen to provide a layer with reasonable tensile strain (lattice parameter less than 5.87 Å) without relaxation of the material which would introduce dislocations and which layer is thick enough to generally place it outside the quantum-well regime in which quantum effects significantly reduce the effect of strain. The tensile strain thus introduced reduces the overall waveguide modal birefringence.

In step 46, select the compositional point 62 for the other layer. It has a bandgap energy substantially larger than that of the first point 60 and has a lattice constant greater than 5.87 Å so as to be in compressive strain and, when including its thickness, so as to counterbalance the tensile strain of the first layer. In view of the requirement to remain within the pseudomorphic limit for both the compressive and tensile

11 layers, they should generally have nearly the same strain energy, as given by the product of the thickness and magnitude of strain. In calculating both the birefringence and the strain compensation, the product of the strain and thickness of a layer is primarily important. In most cases, the compressive and tensile strains provide contributions of different sign to the birefringence.

Both compositions 60 and 62 are chosen to have larger bandgap energies than the photon energy of the light to be guided so that the light is not absorbed in either material.

In step 48, calculate the modal birefringence of the waveguide using Equation (6) as approximately integrated across the layers conveying the light. Repeat steps 44 through 48 of modifying the compositions or thickness of the tensile and compressive layers until the birefringence sufficiently approaches zero, as tested in step 50.

In determining the strain levels, it must be remembered that limits exist as to the amount of strain that can be introduced into a single layer of a given thickness. Also, some present growth technologies limit the amount of arsenic that can be included in the ternary composition InAsP and in low As-fraction InGaAsP. Molecular beam epitaxy seems to allow greater strain than current OMCVD growth techniques. The strain limit is most severely set by the growth apparatus, growth conditions, chemical precursors, and current knowledge of growth chemistry and physics. As this limit is raised, introduction of more strain will benefit the invention.

EXAMPLE

Figure 9:
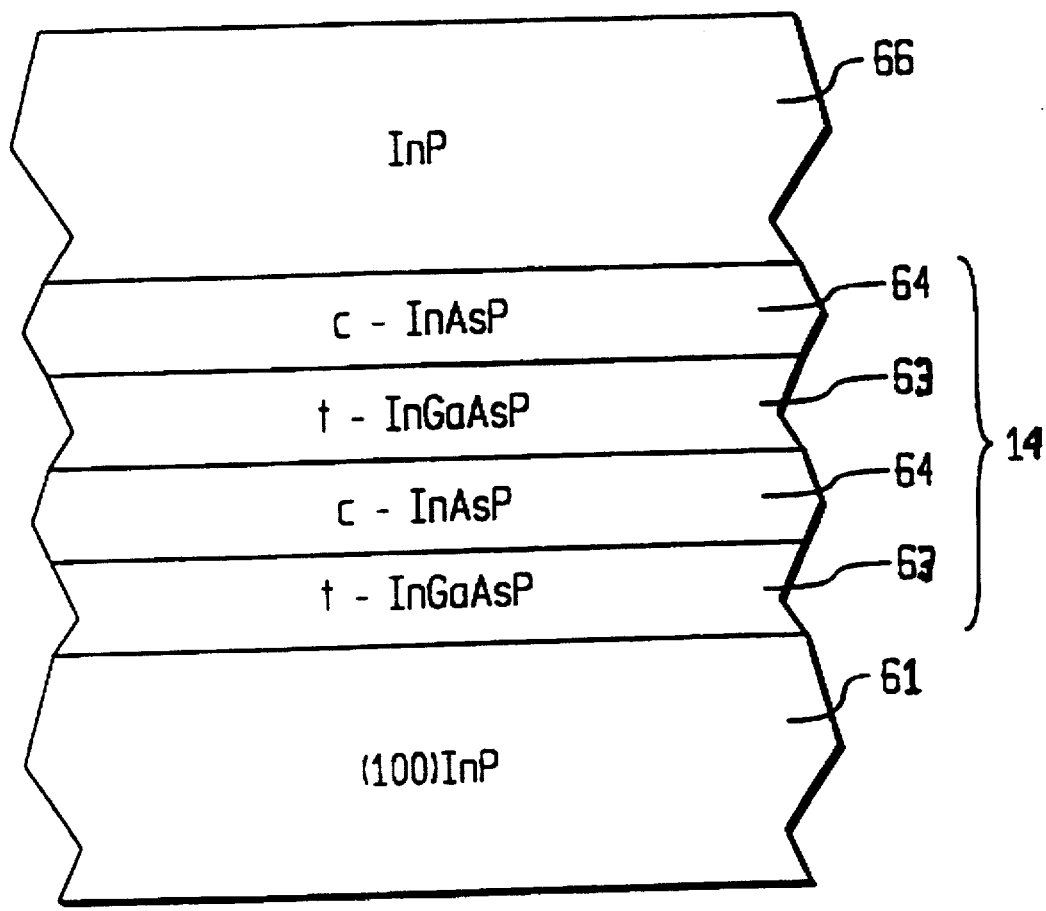
FIG. 9 is a cross section of an embodiment of a waveguide of the invention.

An exemplary embodiment of the invention illustrated in cross section in FIG. 9 was grown and tested. This embodiment was designed for use with 1.5 μm wavelength optical signals and had a nominal 1.21 Q core guide; that is, it had a quaternary composition InGaAsP designed so that the field profile resembled that supported by a waveguide core with a bandgap wavelength in the region of 1.21 μm. The nominal core was decomposed into a 1.08 Q and 1.43 Q superlattice.

A planar waveguide structure, such as shown in FIG. 1, was grown using OMCVD operating at 300 Torr and 520° C. with group-III precursors trimethyl-indium and triethyl-gallium and group-V precursors arsine and phosphine. The structure was deposited on a (100)-oriented InP substrate 61 with an OMCVD-grown InP buffer layer. The waveguide core 14 consisted of a superlattice of 23 pairs of alternately 1.06% tensilely strained quaternary layers 63 of approximate composition $In_{0.5}Ga_{0.5}As_{0.8}P_{0.2}$ of nominal photoluminescence edge wavelength 1.42 μm and of 12.5 μm thickness and 0.65% compressively strained layers 64 of the ternary material of approximate composition $In_{0.21}As_{0.79}P$ of nominal photoluminescence edge wavelength 1.08 μm and of 20 nm thickness. All of the layers 63 and 64 were undoped. The waveguide was capped by a single upper layer 66 of InP.

If the waveguide structure had instead comprised a core of unstrained InGaAsP material of bandgap wavelength 1.21 μm, a modal birefringence of 0.0075 is calculated for guided light with vacuum wavelength in the region of 1.51 μm. The extent of birefringence is sufficient to lead to the direct coincidence of TE and TM signals that are separated by a wavelength in vacuum of approximately 3.5 nm.

However, the structure grown consisting of the described strained layers displayed a birefringence of just 1.1 nm at 1.49 μm vacuum wavelength. That is, when the planar waveguide material was formed into a demultiplexer, inputted signals of TE and TM polarization separated by a vacuum wavelength of just 1.1 nm were coincident at the output. The layer thicknesses and compositions could be further modified to change both the amount of net strain and to further reduce the amount of birefingence experienced at this wavelength.

In the above discussion of compressively strained layers it has been assumed that the sign of the strain induced birefringence is opposite to that of the tensile strained layers. However, as illustrated in FIG. 6, in some cases and for some materials systems, the right hand side of curve 34 moves above zero, so that compressively strained waveguide layers with a high bandgap energy 38 can generate a birefringence that is of the same sign as tensilely strained layers of a bandgap energy 36 that is close to the photon energy of the guided light. In such cases the action of compressive strain adds to (rather than subtracts from) the action of the tensile strained layers in suppressing the modal birefringence of the waveguide.

Throughout the above discussion, it has been assumed that the waveguide layers possess bulk-like material optical properties. However, it is recognised that very thin layers display quantum-size effects and that these quantum-size effects must be taken into account in the predetermination of the layer strains required to suppress the modal birefringence. These quantum-size effects are well described by Zory in *Quantum Well Lasers*, Academic Press, 1994. It is well known that quantum-size effects in quantum wells increase the bandgap and and splits the valence band to thereby increase birefringence in normal waveguide structures. Such quantum effects thus increase the net birefringence that must be compensated by the strain of the invention to yield a waveguide with zero modal birefringence. However, such quantum size effects may be regarded as perturbations and are incidental to the method herein disclosured.

Although the above example used the InGaAsP family with the compositions tending toward the side of InAsP, other III-V and II-VI semiconductor families can advantageously use the invention. In particular, the InGaAsP family can be used with the compositions tending toward the side of InGaAs.

Although the example has attempted to completely balance strain, it is understood that a net total strain is allowed as long as the entire superlattice remains stable against formation of dislocations. Also, although in the above examples the layers of compressive and tensile strains were placed immediately adjacent each other, other, perhaps unstrained, layers can be placed therebetween but still be adjacent in the sense of controlling the total strain to not exceed the pseudomorphic limit.

Also, although the example has concerned a multiply strained layer in the core, the invention can be applied to one or more of the cladding layers, particularly when the modal field distribution significantly extends into the claddings.

Further, although the examples and discussion presented above have assumed a passive optical waveguide, the invention is equally applicable to a waveguide integral to an active device, e.g., one employing optical generation or gain, such as a laser or optical amplifier, or one providing electrical generation, such as a photodetector, or other non-passive device. A typical such active device might sandwich the core 14 doped to one conductivity type with cladding layers 12 and 16 of opposite conductivity type so as to form a p-n junction. Alternatively, the layers forming the p-n junction may be formed above the core 14, which may be undoped or of either conductivity type. The active layer may be only a portion of the core 14 or the core 14 might form only a portion of the active device, or the core may be separated from the active region.

It is understood that the disclosure is not limited to the illustrative example described above or to the exemplary embodiment of a planar guide in the InP/InGaAsP material system, but that it includes all varieties of waveguide structure including, but not limited to, those illustrated in FIGS. 1–4, and all manner of layer structures, geometries, component layer thicknesses, and strains, and to waveguiding structures employing more than one region of high effective index. It is further understood that the method claimed applies generally to semiconductor waveguide material systems taken from the III–V and II–VI group elements.

The invention thus provides a comprehensive and algorithmical solution to obtaining a birefringence-free semiconductor waveguide.

What is claimed is:

1. A reduced birefringence semiconductor waveguide for guiding an optical signal having a photon energy, comprising on a substrate at least one tensilely strained first layer adjacent to at least one compressively strained second layer, said first layer comprising a first semiconductor composition having a first bandgap energy larger than said photon energy and said second layer comprising a second semiconductor composition having a second bandgap energy larger than said first bandgap energy.

2. A waveguide as recited in claim 1, compromising two claddings sandwiching a core, said core including said first and second layers.

3. A waveguide as recited in claim 1, further comprising a cladding layer optically adjacent to a core of said waveguide and including said first and second layers.

4. A waveguide as recited in claim 1, wherein said first and second layers comprise a plurality of respective layers interleaved therebetween.

5. A waveguide as recited in claim 1, wherein said first and second semiconductor compositions have respective coefficients of photoelasticity having opposite signs at said photon energy.

6. A waveguide as recited in claim 1, wherein said first and second semiconductors compositions each comprise compound semiconductors chosen from the III–V and II–VI periodic groups.

7. A waveguide as recited in claim 6, wherein said layers are formed on a substrate of InP.

8. A waveguide as recited in claim 7, wherein a plurality of said first layers and a plurality of said second layers interleaved therebetween form a core of said waveguide.

9. A waveguide as recited in claim 7, wherein said layers have compositions comprising InAsP, InGaAsP, or InGaAs.

10. A waveguide as recited in claim 9, wherein said photon energy corresponds to a free-space wavelength of approximately 1.5 μm.

11. A waveguide as recited in claim 1, wherein said first and second layers are disposed between third and fourth layers of opposite conductivity type, thereby forming an active waveguide.

12. A waveguide as recited in claim 1, further comprising third and fourth layers of opposite conductivity types optically adjacent to said first and second layers.

13. A semiconductor waveguide comprising two cladding layers and a core therebetween and having a structure to waveguide light of a predetermined photon energy, said core comprising a plurality of first layers interleaved with a plurality of second layers, said first layers being in tensile strain and comprising a first semiconductor composition with a first bandgap energy greater than said photon energy, and said second layers being in compressive strain and comprising a second semiconductor composition with a second bandgap energy greater than said photon energy, whereby said bandgaps and said compositions and thicknesses of said first and second layers are chosen such that said waveguide has substantially equal indices of refraction for TE and TM modes of said predetermined photon energy guided by said waveguide.

14. A waveguide as recited in claim 13, wherein said second bandgap energy is greater than said first bandgap energy.

15. A waveguide as recited in claim 13, wherein said photon energy corresponds to a wavelength of approximately 1.5 μm.

16. A waveguide as recited in claim 13, wherein said substrate comprises InP.

17. A waveguide as recited in claim 17, wherein said first and second layers comprise InAsP and at least one of said first and second layers additionally comprises Ga.

18. A method of designing a waveguide, comprising the steps of:

designing a semiconductor waveguide having a core with an average refractive index and a thickness for guiding light having a photon energy;

determining a first birefringence of said semiconductor waveguide;

setting a thickness and composition of a tensilely strained first core layer having a composition with a semiconductor bandgap having a first energy greater than said photon energy; and setting a thickness and composition of a compressively strained second core layer having a composition with a semiconductor bandgap with a second energy greater than said first energy;

wherein said first and second core layers are included in a core region for said semiconductor waveguide and produce a second birefringence of said semiconductor waveguide less than said first birefringence.

19. A method as recited in claim 18, wherein one or more of said first layers and one or more of said second layers have thickness providing said thickness of respective ones of said first and second layers and have respective refractive indices that substantially average to said average refractive index.

20. A method as recited in claim 19, wherein a plurality of said first layers and a plurality of said second layers constitute said core region and have a total thickness substantially equalling said core thickness.

* * * * *